United States Patent
Chan et al.

(10) Patent No.: US 7,602,116 B2
(45) Date of Patent: Oct. 13, 2009

(54) LIGHT APPARATUS CAPABLE OF EMITTING LIGHT OF MULTIPLE WAVELENGTHS USING NANOMETER FLUORESCENT MATERIAL, LIGHT DEVICE AND MANUFACTURING METHOD THEREOF

(75) Inventors: Shih Hsiung Chan, Hukou Township (TW); Jian Shihn Tsang, Lujhou (TW)

(73) Assignee: Advanced Optoelectronic Technology, Inc., Hsinchu County (TW)

( * ) Notice: Subject to any disclaimer, the term of this patent is extended or adjusted under 35 U.S.C. 154(b) by 426 days.

(21) Appl. No.: 11/044,323

(22) Filed: Jan. 27, 2005

(65) Prior Publication Data

US 2006/0164003 A1 Jul. 27, 2006

(51) Int. Cl.
*H01J 1/62* (2006.01)
(52) U.S. Cl. .................. 313/503; 313/501; 313/502; 313/512; 313/498; 257/79; 257/96; 257/100; 252/301.4 R; 252/301.4 H; 252/301.4 F
(58) Field of Classification Search ............ 313/491; 257/98
See application file for complete search history.

(56) References Cited

U.S. PATENT DOCUMENTS

| | | | |
|---|---|---|---|
| 5,959,316 A * | 9/1999 | Lowery | 257/98 |
| 5,995,070 A | 11/1999 | Kitada | |
| 6,501,091 B1 * | 12/2002 | Bawendi et al. | 257/14 |
| 6,614,179 B1 | 9/2003 | Shimizu et al. | |
| 6,870,311 B2 * | 3/2005 | Mueller et al. | 313/491 |
| 7,385,349 B2 * | 6/2008 | Daicho et al. | 313/512 |
| 2002/0186921 A1 * | 12/2002 | Schumacher et al. | 385/31 |
| 2003/0030038 A1 * | 2/2003 | Mitomo et al. | 252/500 |
| 2005/0182461 A1 * | 8/2005 | Hubert et al. | 607/88 |
| 2006/0068154 A1 * | 3/2006 | Parce et al. | 428/76 |
| 2007/0059705 A1 * | 3/2007 | Lu et al. | 435/6 |

* cited by examiner

*Primary Examiner*—Sikha Roy
(74) *Attorney, Agent, or Firm*—Hoffmann & Baron, LLP (57) ABSTRACT

A light apparatus is capable of emitting light of multiple wavelengths using a nanometer fluorescent material. The light apparatus comprises an initial light source that emits initial color light. The initial light source is covered with a transparent film member; and the inside or the surface of the film member, or the initial light source, is coated with at least one nanometer fluorescent material. The nanometer fluorescent material absorbs the initial color light and gets excited, and in the excitement it emits fluorescent light which is different from the initial color light. The initial color light and the fluorescent light combine to form light of multiple wavelengths, and the light of multiple wavelengths is emitted by the light apparatus. Besides, a combination of nanometer fluorescent materials of various particle sizes enables the emission of multiple-wavelength light of various dominant wavelengths.

38 Claims, 5 Drawing Sheets

LIGHT APPARATUS CAPABLE OF EMITTING LIGHT OF MULTIPLE WAVELENGTHS USING NANOMETER FLUORESCENT MATERIAL, LIGHT DEVICE AND MANUFACTURING METHOD THEREOF

BACKGROUND OF THE INVENTION

1. Field of the Invention

The present invention relates to a light apparatus capable of emitting light of multiple wavelengths using a nanometer fluorescent material, a light device and a manufacturing method thereof, and more particularly, to a semiconductor photoelectric device utilizing a nanometer fluorescent material to emit light.

2. Description of the Related Art

A light emitting diode (LED) is a photoelectric device that automatically emits light when electrically connected. Small, electrically efficient and good for initial driving, LEDs are widely used in general illumination, large billboards, and backlight sources for monitors.

At present, according to the semiconductor materials of which they are made, LEDs are divided into different families, namely GaAs, GaAs1-xPx and GaP. In addition, nitrogen-doped semiconductor materials of GaAs1-xPx or GaP families produce rays of multiple colors. In general, light emitted by an LED is characterized by a monochromatic wavelength which depends on the variation of energy involved in light-emitting electron transfer. The lights of wavelengths in use include infrared, red light, green light, yellow light and blue light. Human beings can see lights of different colors because the human eye perceives three different colors of light, namely red light, green light and blue light, which are collectively known as "primary colors" (RGB).

With juxtaposed LEDs of red wavelength, green wavelength and blue wavelength respectively, light of any other color is produced by means of mixing. The U.S. Pat. No. 5,995,070 discloses a displaying device comprising juxtaposed light sources wherein each pixel is composed of diodes of a red light source, a blue light source and two green light sources.

White light produced by mixing light sources of different wavelengths as mentioned above has problems about hue and brightness dispersion, thus it is rather difficult to produce the intended white light. In addition, since the light source of white light is composed of diodes of different electrical properties which have to be controlled by appropriate driving circuits respectively, the design of the system is complex.

Furthermore, the U.S. Pat. No. 6,614,179 discloses a method for producing white light that involves using an LED to emit blue light which, in turn, excites phosphor so that the excited phosphor emits yellow light, and then the two light sources combine to form white light by means of mixing, wherein the wavelength of the blue light ranges between 420 nm and 490 nm, and the phosphor is composed of $\{[(Y, Gd)Sm](AlGa)O:Ce\}$. But the white light produced by the method hardly expresses the real colors of an object, or, in other words, its color temperature is relatively high and thus its color rendering index is unsatisfactory.

Therefore, to develop white light of a high color rendering index, it is necessary to control or regulate the proportions of individual color lights in the light emitted by the light sources so that the emitted light approximates daylight in terms of the proportions of constituents, and in consequence colors of an object illuminated by the emitted light look vivid. Beside, as regards fluorescent materials, the focus of their research and development is the constituents of yttrium aluminum garnet (YAG) crystal (molecular formula: $X_3(A_3B_2)O_{12}$) for the time being, for example, $Y_3(Al_3Al_2)O_{12}$, $(Y_{3-x}Ce_x)Al_5O_{12}$, $(Y_{2.9}Tb_{0.05})Al_5O_{12}$, and $(Y_{2.95-a}Ce_{0.05}Gd_a)(Al_{5-b}Ga_b)O_{12}$ in YAG phosphor structure.

In short, the market is urgently in need of a light apparatus that not only emits light similar to daylight in terms of proportions of constituents but also features high luminance efficiency and adequate brightness.

SUMMARY OF THE INVENTION

An objective of the present invention is to provide a light apparatus and a light device that emit light of multiple wavelengths using a nanometer fluorescent material and the manufacturing method thereof, wherein the nanometer phosphor absorbs the initial color light emitted by the light device and gets excited, and in the excitement the nanometer phosphor emits a fluorescent light source which is different from the initial color light. The initial color light and the fluorescent light source combine to form the light apparatus for emitting light of multiple wavelengths.

Another objective of the present invention is to provide a light apparatus for emitting light of multiple wavelengths by regulating the size of the nanometer particles of the fluorescent material, wherein a light source of white light is acquired by mixing a nanometer fluorescent material of different particle sizes To achieve the objectives, the present invention discloses a light apparatus and a light device that emit light of multiple wavelengths using a nanometer fluorescent material and the manufacturing method thereof, wherein the light apparatus comprises an initial light source that emits initial color light. The initial light source is covered with a transparent molding member; and the inside or the surface of the film member, or the initial light source, is coated or mixed with at least one nanometer fluorescent material. The nanometer fluorescent material absorbs the initial color light and gets excited, and in the excitement it emits fluorescent light which is different from the initial color light in wavelength. The initial color light and the fluorescent light are to combine to form light of multiple wavelengths, and the light of multiple wavelengths is emitted by the light apparatus. Besides, a combination of nanometer fluorescent materials of various particle sizes enables the emission of multiple-wavelength light in various dominant wavelengths.

An LED, preferably a nitride semiconductor-based LED, functions as the initial light source.

The nanometer fluorescent material is composed of organic fluorescent material and inorganic fluorescent material. It is directly applied to the surface of the initial light source or the surface of the molding member. It may also be applied to the inside of the molding member.

The method for manufacturing the light apparatus involves the following steps: providing an initial light source capable of emitting initial color light which is installed by fixing and electrically connecting a light device to a lead frame or a substrate; coating the initial light source with at least one layer of nanometer fluorescent material; finally, coating and protecting both the initial light source and the nanometer fluorescent material with a molding member.

BRIEF DESCRIPTION OF THE DRAWINGS

The invention will be described according to the appended drawings in which.

PREFERRED EMBODIMENT OF THE PRESENT INVENTION

As discovered by research and development of nanotechnology, when material particles are miniaturized to the size of nano-scale, it would create quantum effect, and at that point there would be changes in the energy level, physical properties and chemical properties of the material. As shown in Table 1, fluorescent material CdSe which has a particle size of 2.8 nm produces green fluorescence with a wavelength of 533 nm when excited, and with a particle size of 4.0 nm it produces orange fluorescence with a wavelength of 585 nm when excited, and with a particle size of 5.6 nm it produces red fluorescence with a wavelength of 640 nm when excited. The aforesaid data indicate that wavelength of emitted light can be regulated and controlled by means of the size of nano-particles. A light source with multiple wavelengths and a high color rendering index can be produced, using particles of various sizes. Assuming there is an LED that emits blue light and is coated with a fluorescent material composed of 2.8 nm particles and 5.6 nm particles, it is feasible to combine three rays of light of red wavelength, green wavelength and blue wavelength respectively to produce white light.

TABLE 1

Sizes of Nano-particles and the Fluorescence Produced thereby

Unit: nm

| | Color of Fluorescence | | | | |
|---|---|---|---|---|---|
| | Green | Yellow | Orange | Reddish Orange | Red |
| Emission Wavelength | 535 ± 10 | 560 ± 10 | 585 ± 10 | 610 ± 10 | 640 ± 10 |
| Peak Wavelength | 522 | 547 | 572 | 597 | 627 |
| Size of Particles | 2.8 | 3.5 | 4.0 | 4.7 | 5.6 |

Figure 1:
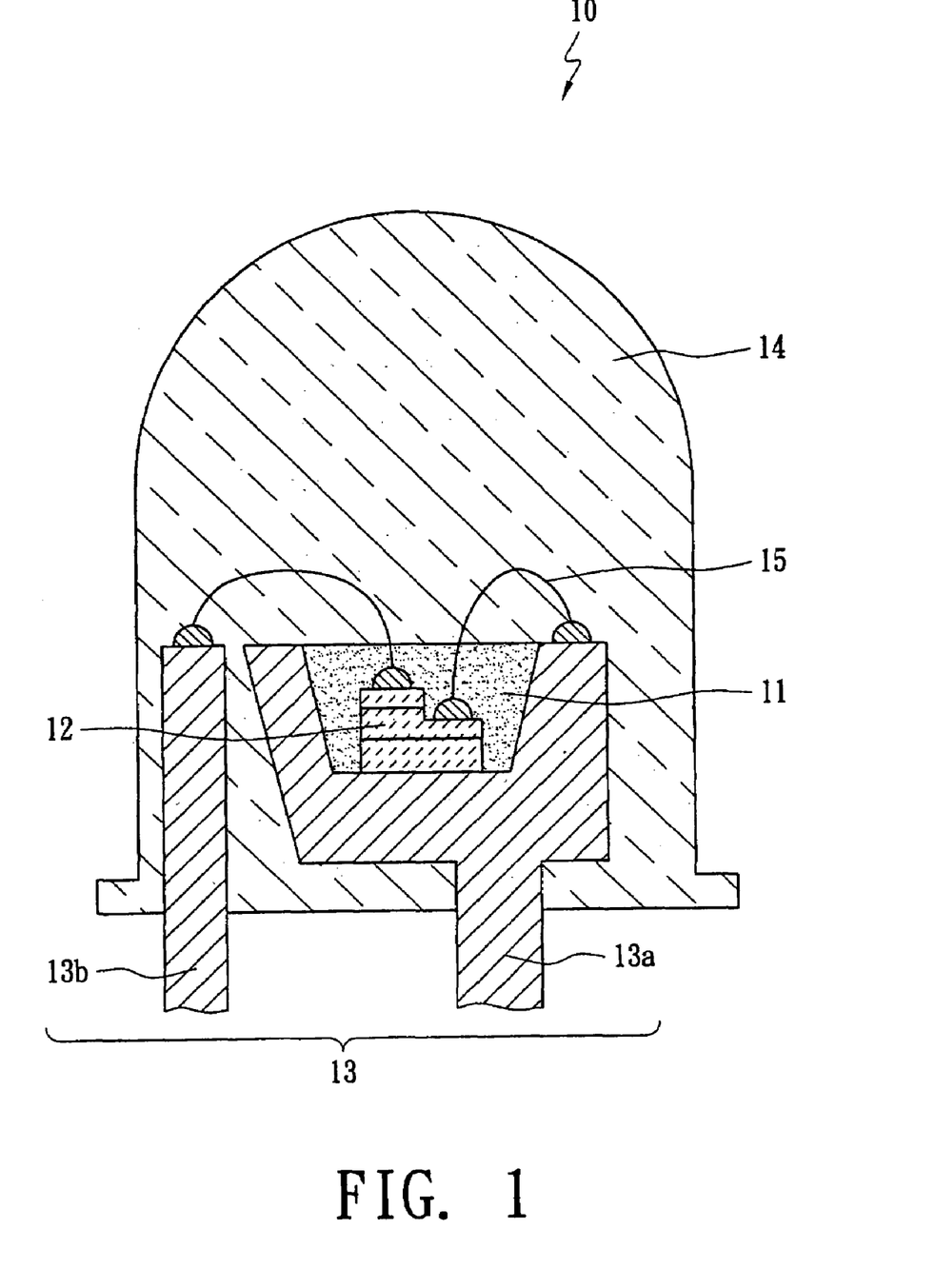
FIG. 1 is a schematic diagram of a light apparatus for emitting light of multiple wavelengths in accordance with the first embodiment of the present invention.

FIG. 1 is a schematic diagram of a light apparatus for emitting light of multiple wavelengths in accordance with the present invention. The light apparatus 10 comprises a die (or a chip) 12 of the light device fixed to the cup-shaped member of a lead frame 13; and the die 12, which is electrically connected to the cathode 13a and anode 13b of the lead frame 13 respectively through a wire 15, can be either an LED or a laser diode. The cup-shaped member is filled with a nanometer fluorescent material 11, thus the die 12 emits initial color light when electrically connected, and in consequence the surrounding nanometer fluorescent material 11 is excited by the initial light so as to emit fluorescent light which is different from the initial color light in wavelength. The initial color light and the fluorescent light are to combine to form light of multiple wavelengths, and the light of multiple wavelengths is emitted after penetrating a molding member 14.

The nanometer fluorescent material 11 is either an organic material or an inorganic material, or it can be a combination of the two materials. The inorganic material is a mixture of oxides, nitrides, nitrogen oxides or sulfides, of one, or more than one, nano-particle size or constituent, for example, silicon oxide, silicon oxy-nitride, silicon nitride, aluminum oxide, zinc oxide, yttrium aluminum garnet (YAG) phosphor, etc.; it can also be a mixture of nano-materials of various particle sizes, such as zinc sulfide (ZnS), zinc selenide (ZnSe), zinc telluride (ZnTe), cadmium sulfide (CdS), cadmium selenide (CdSe), cadmium telluride (CdTe), lead selenide (PbSe), gallium nitride (GaN), aluminum nitride (AlN), aluminum gallium nitride (AlGaN), aluminum indium gallium nitride (AlInGaN), gallium phosphide (GaP), gallium arsenic phosphide (GaAsP), gallium arsenide (GaAs), aluminum arsenide (AlAs), aluminum gallium arsenide (AlGaAs), aluminum gallium indium phosphide (AlGaInP), indium gallium phosphide (InGaP), indium aluminum phosphide (InAlP), silicon (Si), germanium (Ge), silicon carbide (SiC), or carbon (C). Furthermore, the organic material is a mixture of one, or more than one, silicic polymer, such as silicones, epoxies, and polymers. Hence, the nanometer fluorescent material 11 can be excited, and in the excitement it emits fluorescent light of single wavelength or multiple wavelengths.

Figure 2:
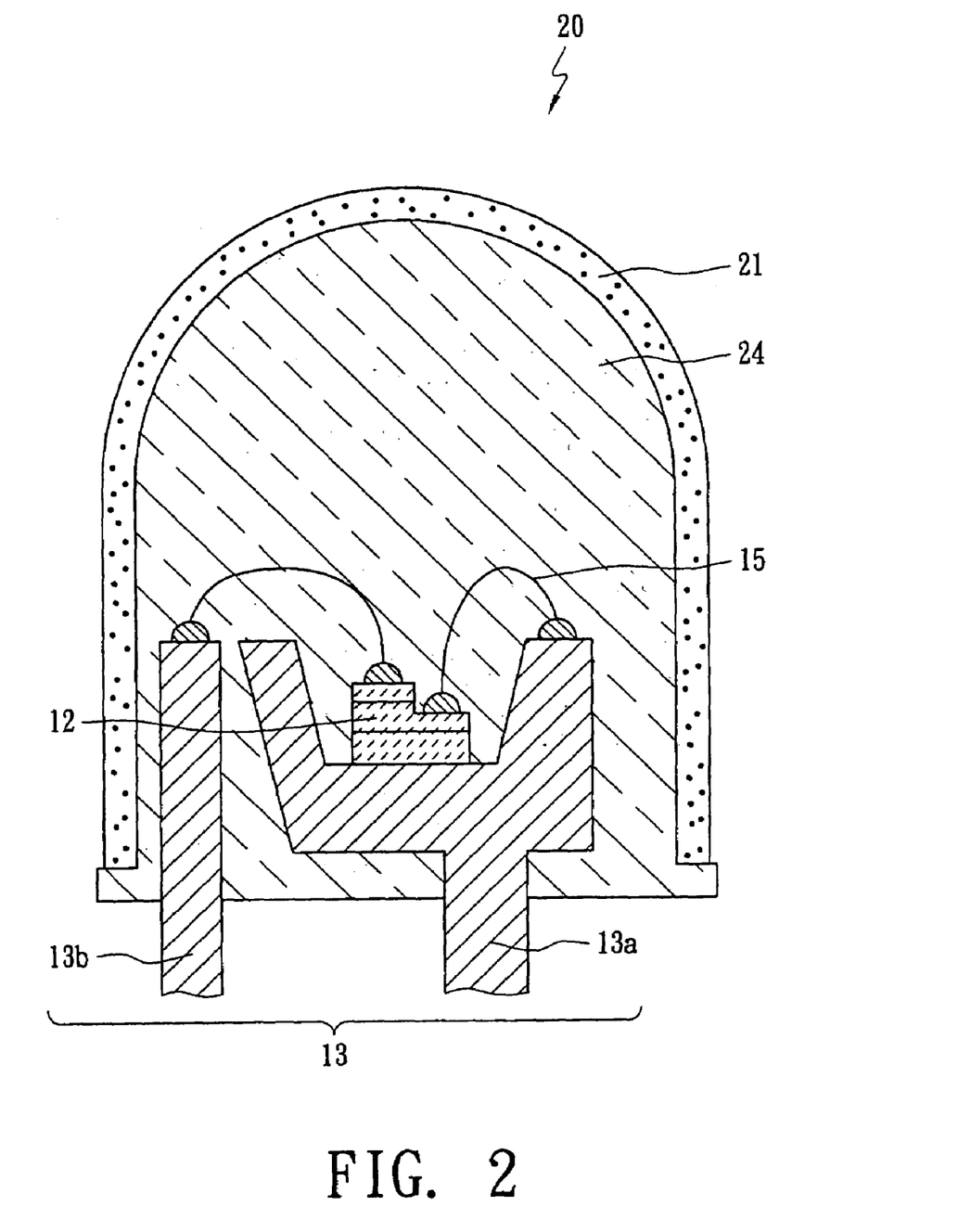
FIG. 2 is a schematic diagram of a light apparatus for emitting light of multiple wavelengths in accordance with the second embodiment of the present invention.

The nanometer fluorescent material 11 is overlaid on the die 12 as shown in FIG. 1. On contrast, a nanometer fluorescent material 21 is also applied or attached to the surface of the molding member 24 as shown in FIG. 2. Initial color light emitted by the die 12 of the LED penetrates the molding member 24 before it excites the nanometer fluorescent material 21, and in consequence the excited nanometer fluorescent material 21 emits fluorescent light, wherein the LED is preferably made of nitride semiconductor, such as nitrides of aluminum, gallium and indium. Alternatively, a laser diode may function as the initial light source.

Figure 3:
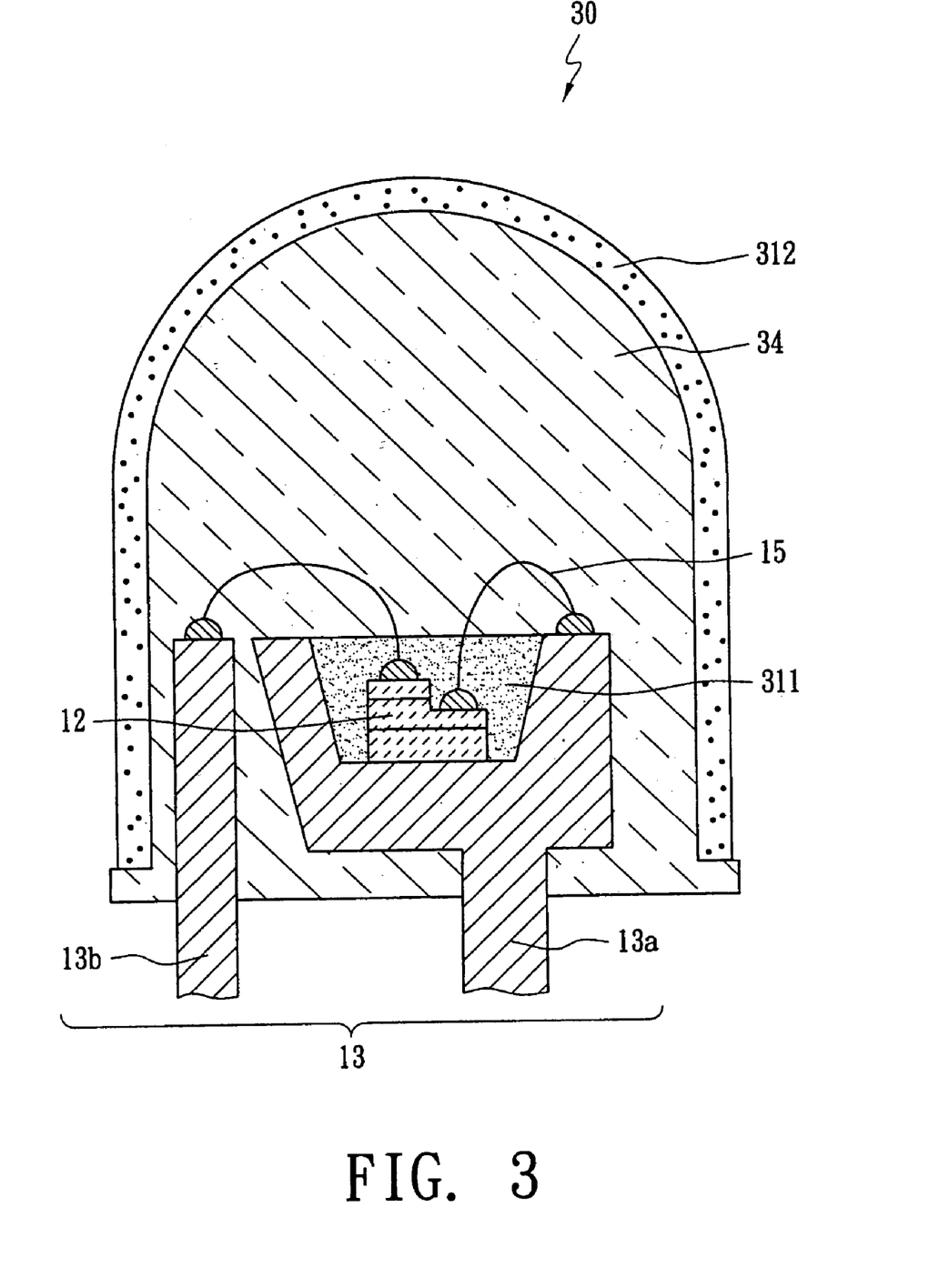
FIG. 3 is a schematic diagram of another light apparatus for emitting light of multiple wavelengths in accordance with the present invention.

FIG. 3 is a schematic diagram of another light apparatus for emitting light of multiple wavelengths in accordance with the present invention. The molding member 34 of the light apparatus 30 is coated with a layer of nanometer fluorescent material 312. The area surrounding the die 12 is also covered with another nanometer fluorescent material 311.

Figure 4:
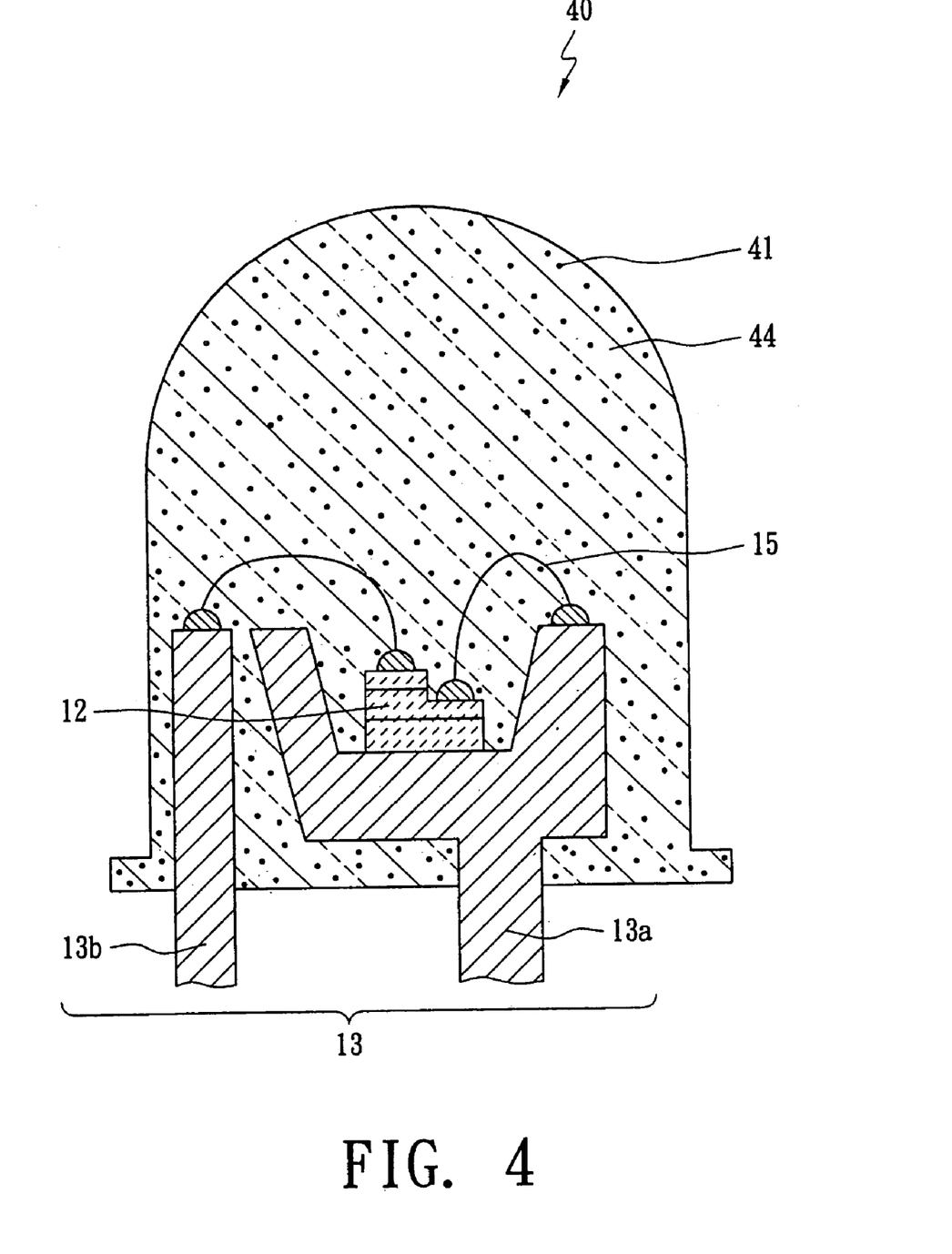
FIG. 4 is a schematic diagram of another light apparatus for emitting light of multiple wavelengths in accordance with the present invention.

In addition, a nanometer fluorescent material 41 may also be found inside the film member 44, as shown in FIG. 4. During a molding process, a molding compound which is a mixture of the nanometer fluorescent material 41 and epoxy is injected into the mold to form the light apparatus 40, as shown in FIG. 4.

Figure 5:
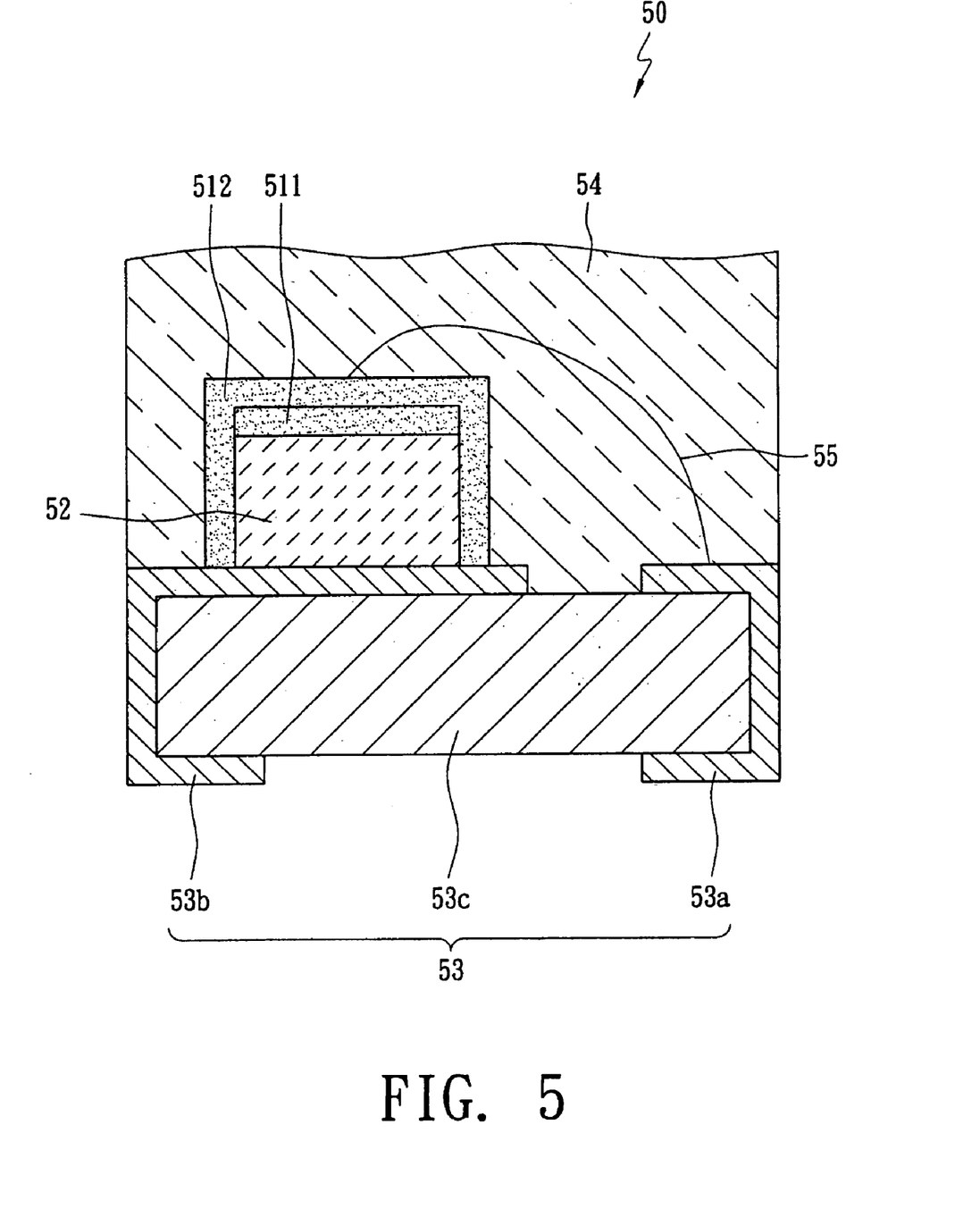
FIG. 5 is a schematic diagram of another light apparatus for emitting light of multiple wavelengths in accordance with the present invention.

FIG. 5 is a schematic diagram of another light apparatus for emitting light of multiple wavelengths in accordance with the present invention. Unlike the aforesaid diagrams which depict a pin type package, FIG. 5 illustrates an SMD (surface mount device) type light apparatus 50. A die 52 is fixed to an n-type conductive copper foil 53b on the surface of an insulation layer 53c and electrically connected to a p-type conductive copper foil 53a through a wire 55. The p-type conductive copper foil 53a, the n-type conductive copper foil 53b, and the insulation layer 53c together form a substrate 53 with circuits. The nanometer fluorescent materials 511 and 512 may be applied to the surface of the die 52 before a molding member 54 is overlaid on the substrate 53. Furthermore, the nanometer fluorescent material 511 may also be directly formed on the surface of the die 52 by means of a deposition process.

The above-described embodiments of the present invention are intended to be illustrative only. Numerous alternative embodiments may be devised by persons skilled in the art without departing from the scope of the following claims.

What is claimed is:

1. A light apparatus capable of emitting light of multiple wavelengths using a nanometer phosphor material, comprising:
    an initial light source for emitting initial color light;
    a molding member overlaid on the initial light source; and
    at least one nanometer phosphor material with various particle sizes for being excited by the initial color light so as to emit fluorescent light which is different from the initial color light, wherein the nanometer phosphor material with the particle size of 2.8 nm emits the fluorescent light with a peak wavelength of 522 nm and the nanometer phosphor material with the particle size of 5.6 nm emits the fluorescent light with a peak wavelength of 627 nm;
    whereby the initial color light is mixed with the fluorescent light to emit light of multiple wavelengths.

2. The light apparatus capable of emitting light of multiple wavelengths using a nanometer phosphor material of claim 1, wherein the initial light source is a light emitting diode (LED).

3. The light apparatus capable of emitting light of multiple wavelengths using a nanometer phosphor material of claim 2, wherein the LED is a nitride semiconductor-based LED.

4. The light apparatus capable of emitting light of multiple wavelengths using a nanometer phosphor material of claim 1, wherein the nanometer phosphor material is composed of at least one of an organic material and an inorganic material.

5. The light apparatus capable of emitting light of multiple wavelengths using a nanometer phosphor material of claim 1, wherein the nanometer phosphor material is a mixture of nano-materials of various particle sizes.

6. The light apparatus capable of emitting light of multiple wavelengths using a nanometer phosphor material of claim 4, wherein the inorganic material is composed of at least one of zinc sulfide (ZnS), zinc selenide (ZnSe), zinc telluride (ZnTe), cadmium sulfide (CdS), cadmium selenide (CdSe), cadmium telluride (CdTe), lead selenide (PbSe), gallium nitride (GaN), aluminum nitride (AlN), aluminum gallium nitride (AlGaN), aluminum indium gallium nitride (AlInGaN), gallium phosphide (GaP), gallium arsenic phosphide (GaAsP), gallium arsenide (GaAs), aluminum arsenide (AlAs), aluminum gallium arsenide (AlGaAs), aluminum gallium indium phosphide (AlGaInP), indium gallium phosphide (InGaP), indium aluminum phosphide (InAlP), silicon (Si), germanium (Ge), silicon carbide (SiC) and carbon (C).

7. The light apparatus capable of emitting light of multiple wavelengths using a nanometer phosphor material of claim 4, wherein the inorganic material is composed of at least one compound of oxides, nitrides, nitrogen oxides and sulfides.

8. The light apparatus capable of emitting light of multiple wavelengths using a nanometer phosphor material of claim 7, wherein the compound includes at least one of silicon oxide, silicon oxy-nitride, silicon nitride, aluminum oxide, zinc oxide and yttrium aluminum garnet (YAG) phosphor.

9. The light apparatus capable of emitting light of multiple wavelengths using a nanometer phosphor material of claim 4, wherein the organic material is composed of at least one of silicones, epoxies, and silicic polymers.

10. The light apparatus capable of emitting light of multiple wavelengths using a nanometer phosphor material of claim 1, wherein the nanometer phosphor material is overlaid on the initial light source directly.

11. The light apparatus capable of emitting light of multiple wavelengths using a nanometer phosphor material of claim 1, wherein the nanometer phosphor material is dispersed in the molding member.

12. The light apparatus capable of emitting light of multiple wavelengths using a nanometer phosphor material of claim 1, wherein the nanometer phosphor material is covered on the surface of the molding member.

13. A manufacturing method of a light apparatus capable of emitting light of multiple wavelengths using a nanometer phosphor material, comprising the steps of:
    providing an initial light source capable of emitting initial color light;
    coating the initial light source with at least one nanometer phosphor material with various particle sizes, wherein the nanometer phosphor material with the particle size of 2.8 nm emits the fluorescent light with a peak wavelength of 522 nm and the nanometer phosphor material with the particle size of 5.6 nm emits the fluorescent light with a peak wavelength of 627 nm; and
    overlaying the initial light source with a molding member.

14. The manufacturing method of a light apparatus capable of emitting light of multiple wavelengths using a nanometer phosphor material of claim 13, further comprising a step of fixing a light emitting device on a lead frame to form the initial light source.

15. The manufacturing method of a light apparatus capable of emitting light of multiple wavelengths using a nanometer phosphor material of claim 14, wherein the light emitting device is a light emitting diode (LED) or a laser diode.

16. The manufacturing method of a light apparatus capable of emitting light of multiple wavelengths using a nanometer phosphor material of claim 15, wherein the LED is a nitride semiconductor-based LED.

17. The manufacturing method of a light apparatus capable of emitting light of multiple wavelengths using a nanometer phosphor material of claim 13, wherein the nanometer phosphor material is deposited on the initial light source by means of a semiconductor manufacture process.

18. The manufacturing method of a light apparatus capable of emitting light of multiple wavelengths using a nanometer phosphor material of claim 13, wherein the nanometer phosphor material is composed of at least one of an organic material and an inorganic material.

19. The manufacturing method of a light apparatus capable of emitting light of multiple wavelengths using a nanometer phosphor material of claim 13, wherein the nanometer phosphor material is a mixture of nano-materials of various particle sizes.

20. The manufacturing method of a light apparatus capable of emitting light of multiple wavelengths using a nanometer phosphor material of claim 18, wherein the inorganic material is composed of at least one of zinc sulfide (ZnS), zinc selenide (ZnSe), zinc telluride (ZnTe), cadmium sulfide (CdS), cadmium selenide (CdSe), cadmium telluride (CdTe), lead selenide (PbSe), gallium nitride (GaN), aluminum nitride (AlN), aluminum indium gallium nitride (AlGaN), aluminum indium gallium nitride (AlInGaN), gallium phosphide (GaP), gallium arsenic phosphide (GaAsP), gallium arsenide (GaAs), aluminum arsenide (AlAs), aluminum gallium arsenide (AlGaAs), aluminum gallium indium phosphide (AlGaInP), indium gallium phosphide (InGaP), indium aluminum phosphide (InAlP), silicon (Si), germanium (Ge), silicon carbide (SiC) and carbon (C).

21. The manufacturing method of a light apparatus capable of emitting light of multiple wavelengths using a nanometer phosphor material of claim 18, wherein the inorganic material is composed of at least one compound of oxides, nitrides, nitrogen oxides and sulfides.

22. The manufacturing method of a light apparatus capable of emitting light of multiple wavelengths using a nanometer phosphor material of claim 21, wherein the compound includes at least one of silicon oxide, silicon oxy-nitride, silicon nitride, aluminum oxide, zinc oxide and yttrium aluminum garnet (YAG) phosphor.

23. The manufacturing method of a light apparatus capable of emitting light of multiple wavelengths using a nanometer phosphor material of claim 18, wherein the organic material is composed of at least one of silicones, epoxies, and silicic polymers.

24. The manufacturing method of a light apparatus capable of emitting light of multiple wavelengths using a nanometer phosphor material of claim 14, wherein the nanometer phosphor material is overlaid on the light emitting device.

25. The manufacturing method of a light apparatus capable of emitting light of multiple wavelengths using a nanometer phosphor material of claim 14, wherein the nanometer phosphor material is interposed between the light emitting device and molding member.

26. The manufacturing method of a light apparatus capable of emitting light of multiple wavelengths using a nanometer phosphor material of claim 14, further comprising a step of dispersing another nanometer phosphor material into the molding member.

27. The manufacturing method of a light apparatus capable of emitting light of multiple wavelengths using a nanometer phosphor material of claim 13, further comprising a step of coating another nanometer phosphor material on the surface of the molding member.

28. A light device emitting light of multiple wavelengths using a nanometer fluorescent material, comprising:
    an electroluminescent semiconductor for emitting initial color light; and
    at least one nanometer fluorescent material combined with the electroluminescent semiconductor and used for being excited by the initial color light to emit fluorescent light which is different from the initial color light, wherein the nanometer fluorescent material is composed of at least one of lead selenide (PbSe) and silicon oxide (SiG) and the nanometer fluorescent material with a particle size of 2.8 nm emits the fluorescent light with a peak wavelength of 522 nm and the nanometer fluorescent material with a particle size of 5.6 nm emits the fluorescent light with a peak wavelength of 627 nm.

29. The light device emitting light of multiple wavelengths using a nanometer fluorescent material of claim 28, wherein the electroluminescent semiconductor is a light emitting diode (LED).

30. The light device emitting light of multiple wavelengths using a nanometer fluorescent material of claim 29, wherein the LED is a nitride semiconductor-based LED.

31. The light device emitting light of multiple wavelengths using a nanometer fluorescent material of claim 28, wherein the nanometer fluorescent material is a mixture of nano-materials of various particle sizes.

32. The light device emitting light of multiple wavelengths using a nanometer fluorescent material of claim 28, wherein the nanometer fluorescent material is composed of at least one fluorescent layer.

33. The light device emitting light of multiple wavelengths using a nanometer fluorescent material of claim 28, wherein the nanometer fluorescent material is deposited on the electroluminescent semiconductor.

34. A manufacturing method of a light device emitting light of multiple wavelengths using a nanometer fluorescent material, comprising the steps of:
    providing an electroluminescent semiconductor capable of emitting initial color light; and
    overlaying the electroluminescent semiconductor with at least one nanometer fluorescent material composed of at least one of lead selenide (PbSe) and silicon oxide (SiO), wherein the nanometer fluorescent material with a particle size of 2.8 nm emits fluorescent light with a peak wavelength of 522 nm and the nanometer fluorescent material with a particle size of 5.6 nm emits fluorescent light with a peak wavelength of 627 nm.

35. The manufacturing method of a light device emitting light of multiple wavelengths using a nanometer fluorescent material of claim 34, wherein the electroluminescent semiconductor is a light emitting diode (LED) or a laser diode.

36. The manufacturing method of a light device emitting light of multiple wavelengths using a nanometer fluorescent material of claim 35, wherein the LED is a nitride semiconductor-based LED.

37. The manufacturing method of a light device emitting light of multiple wavelengths using a nanometer fluorescent material of claim 34, wherein the nanometer fluorescent material is a mixture of nano-materials of various particle sizes.

38. The manufacturing method of a light device emitting light of multiple wavelengths using a nanometer fluorescent material of claim 34, wherein the nanometer fluorescent material is deposited on the electroluminescent semiconductor.

* * * * *

UNITED STATES PATENT AND TRADEMARK OFFICE
CERTIFICATE OF CORRECTION

PATENT NO. : 7,602,116 B2
APPLICATION NO. : 11/044323
DATED : October 13, 2009
INVENTOR(S) : Chan et al.

It is certified that error appears in the above-identified patent and that said Letters Patent is hereby corrected as shown below:

Column 7, line 49:

Now reads: "(SiG) and the nanometer fluorescent material"

Should read: -- (SiO) and the nanometer fluorescent material --

Signed and Sealed this

Twentieth Day of April, 2010

David J. Kappos
*Director of the United States Patent and Trademark Office*